United States Patent
Tu et al.

(10) Patent No.: US 7,554,469 B2
(45) Date of Patent: Jun. 30, 2009

(54) METHOD FOR GAIN ERROR ESTIMATION IN AN ANALOG-TO-DIGITAL CONVERTER AND MODULE THEREOF

(75) Inventors: Yu-Hsuan Tu, Tainan (TW); Yi-Fu Chen, Taipei (TW); Kang-Wei Hsueh, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/123,522

(22) Filed: May 20, 2008

(65) Prior Publication Data
US 2009/0051574 A1    Feb. 26, 2009

Related U.S. Application Data

(60) Provisional application No. 60/956,956, filed on Aug. 21, 2007.

(51) Int. Cl.
*H03M 1/06* (2006.01)
(52) U.S. Cl. .................. 341/118; 341/120; 341/161
(58) Field of Classification Search .......... 341/118, 341/120, 161
See application file for complete search history.

(56) References Cited

U.S. PATENT DOCUMENTS

| 6,563,445 | B1* | 5/2003 | Sabouri | 341/120 |
| 6,970,125 | B2* | 11/2005 | Cesura et al. | 341/161 |
| 7,280,064 | B2* | 10/2007 | Lin | 341/155 |

* cited by examiner

*Primary Examiner*—Khai M Nguyen
(74) *Attorney, Agent, or Firm*—Thomas, Kayden, Horstemeyer & Risley

(57) ABSTRACT

The invention provides a method for gain error estimation in an analog-to-digital converter. In one embodiment, the analog-to-digital converter comprises a plurality of stages. A series of correction numbers applied to a target stage selected from the stages are correlated with a series of calculation values calculated according to digital output values of the stages to generate a series of gain error estimates. The series of gain error estimates are multiplied by a series of updating parameters to obtain a series of first values. A series of previous gain error values are multiplied by one minus the corresponding updating parameters to obtain a series of second values, wherein the series of previous gain values are obtained by delaying the present gain error values. The series of first values and the series of second values are correspondingly added to obtain a series of present gain error values for gain error correction.

24 Claims, 7 Drawing Sheets

METHOD FOR GAIN ERROR ESTIMATION IN AN ANALOG-TO-DIGITAL CONVERTER AND MODULE THEREOF

CROSS REFERENCE TO RELATED APPLICATIONS

This application claims the benefit of U.S. Provisional Application No. 60/956,956, filed on Aug. 21, 2007.

BACKGROUND OF THE INVENTION

1. Field of the Invention

The invention relates to analog-to-digital converters, and more particularly to gain error estimation of analog-to-digital converters.

2. Description of the Related Art

Referring to FIG. 1, a block diagram of a pipelined analog-to-digital converter (ADC) 100 is shown. The pipelined ADC 100 converts an analog input signal $V_{in}$ from analog to digital to obtain a digital conversion value $D_{out}$ as an output thereof. The pipelined ADC 100 comprises M stages 101~10M connected in series and a gain error estimation module 110. The first stage 101 derives a digital output value $d_{o1}$ from the analog input signal $V_{in}$ and generates a residual signal $R_1$ indicating a difference between the analog input signal $V_{in}$ and the digital output value $d_{o1}$. The stages 102~10M then receive residual signals $R_1$~$R_{M-1}$ of prior stages 101~10(M−1) thereof as input signals and respectively derive digital output values $d_{o1}$~$d_{oM}$ from the input signals thereof. Accordingly, the stages 102~110(M−1) also generate residual signals $R_2$~$R_{M-1}$ indicating differences between the input signals $R_1$~$R_{M-2}$ thereof and the digital output values $d_{o1}$~$d_{o(M-1)}$ thereof. The gain error estimation module 110 then calculates the digital conversion value $D_{out}$ according to the digital output values $d_{o1}$~$d_{oM}$ of the stages 101~10N as the output signal of the pipelined ADC 100.

Before a residual signal of a current stage is output to a subsequent stage as an input, the residual signal is amplified with an amplifier according to a predetermined gain of the current stage. Referring to FIG. 2A, a block diagram of a k-th stage 200 is shown. The k-th stage 200 comprises a sub analog-to-digital converter 202, a sub digital-to-analog converter 204, a summing stage 206, and an amplifier 208. The sub ADC 202 first converts a residual signal $R_{k-1}$ of a (k−1)-th stage prior to the k-th stage 200 from analog to digital to obtain a digital output value $d_{ok}$. The sub DAC 204 then converts the digital output value $d_{ok}$ from digital back to analog to obtain a signal $X_k$. The summing stage 206 then subtracts the signal $X_k$ from the residual signal $R_{k-1}$ to obtain a signal $Y_k$, representing a difference between the input signal $R_{k-1}$ and the digital output value $d_{ok}$. The amplifier 208 then amplifies the signal $Y_k$ according to a predetermined gain G to obtain a residual signal $R_k$ of the current stage 200.

Although in the methodology, the predetermined gain G is presumed constant, the actual gain of the amplifier 208 deviates from the predetermined gain G with temperature changes and circuit manufacturing variations. The difference between the actual gain and the predetermined gain is referred to as a gain error of a stage. When the actual gain of the current stage deviates from the predetermined gain, a gain error occurs, and the residual signal output by the current stage has an amplitude error, which induces errors in digital output values of subsequent stages. The gain error estimation module 110 therefore must estimate a gain error and calibrate the digital conversion value $D_{out}$ according to the gain error. Otherwise, accuracy and resolution of the digital conversion value $D_{out}$ decreases.

In FIG. 1, the gain error estimation module 110 applies a series of correction numbers S to the first stage 101 for estimation of the gain error of the first stage 101. Referring to FIG. 2B, a block diagram of a target stage 250 for gain error estimation is shown. In addition to a sub ADC 252, a sub DAC 254, a summing stage 256, and an amplifier 258, the target stage 250 further includes an adder 252 adding a correction number S and a stage output value $d_{o1}$ to obtain a signal $Z_1$. The sub DAC 254 then converts the signal $Z_1$ from digital to analog to obtain a signal $X_1$, the summing stage 256 then subtracts the signal $X_1$ from the input signal $V_{in}$ to obtain a signal $Y_1$, and the amplifier 258 amplifies the signal $Y_1$ to obtain a residual signal $R_1$ of the target stage 250. Therefore, the residual signal $R_1$ and digital output values $d_{o2}$~$d_{oM}$ of the subsequent stages 102~10N of the target stage 101 also change with the correction number S.

As the digital output values $d_{o2}$~$d_{oM}$ change with the correction number S, the gain error estimation module 110 estimates a gain error of the target stage 101 according to the digital output values $d_{o2}$~$d_{oM}$ and the correction number S. In reference to FIG. 1 and FIG. 2B, the following equation (1) is given:

$$(V_{in}-d_{o1}-s)G^{M-1}(1+\epsilon)=d_{o2}G^{M-2}+d_{o3}G^{M-3}+\Lambda+d_{o(M-1)}G+d_{oM}; \quad (1)$$

wherein $V_{in}$ is the input signal of the target stage 101, G is predetermined gains of stages 101~10M, M is a number of stages, s is the correction number applied to the target stage, and $\epsilon$ is a gain error of the target stage 101. Meanwhile, equation (2) is derived from equation (1) as follows:

$$V_{in}+\epsilon\cdot V_{in}-\epsilon\cdot d_{o1}-\epsilon\cdot s=(d_{o1}+s)+d_{o2}G^{-1}+d_{o3}G^{-2}+\Lambda+d_{oM}G^{-(M-1)}. \quad (2)$$

If equation (2) is divided by the correction number 5 and averaged over N samples, the following equation (3) is obtained:

$$-\epsilon = \frac{1}{N}\sum_{n=1}^{N}\frac{d_{o1}[n]+s[n]+d_{o2}[n]\cdot G^{-1}+d_{o3}[n]\cdot G^{-2}+\Lambda+d_{oM}[n]\cdot G^{-(M-1)}}{s[n]} \quad (3)$$

$$= \frac{1}{N}\sum_{n=1}^{N}\frac{u[n]}{s[n]}$$

$$= \frac{1}{N}\sum_{n=1}^{N}v[n]$$

The gain error estimation module 110 can average a large amount of gain error estimates v[n] to obtain the gain error $\epsilon$ of the target stage 101 according to the equation (3) as $$\frac{1}{N}\sum_{n=1}^{N}\frac{V_{in}}{s[n]} \text{ and } \frac{1}{N}\sum_{n=1}^{N}\frac{d_{o1}[n]}{s[n]}$$

are equal to zero when the number N of samples is large enough.

Thus, according to equation (3), the gain error estimation module 110 first calculates gain error estimates v[n] corresponding to each sample index n and then averages a large amount of gain error estimates v[n] to obtain a gain error of the target stage 101. To increase the effective number of bits (ENOB) of the digital conversion value $D_{out}$, the number N of the averaged gain error estimates v[n] must be large enough for the resolution of the gain error ε to remain higher than a tolerable threshold. The gain error estimation module 110 therefore requires a large amount of memory space to store the gain error estimates v[n].

Referring to FIG. 3, a block diagram of a portion of a conventional gain error estimation module 300 of a pipelined ADC is shown. The conventional gain error estimation module 300 comprises a correlation module 302, an accumulation module 304, and an estimate error module 306. To estimate a gain error of a target stage of the pipelined ADC, the gain error estimation module 300 first derives a series of calculation values u[n] according to digital output values of the stages of the pipelined ADC according to the following algorithm:

$$u[n]=d_{o1}[n]+s[n]+d_{o2}[n]\times G^{-1}+d_{o3}[n]\times G^{-2}+\Lambda+d_{oM}[n]\times G^{-(M-1)};\quad (4)$$

wherein n is a sample index, s[n] is the correction number, M is equal to a number of the stages, G is a predetermined gain of the stages, $d_{o1}[n]$ is a digital output value of the target stage, and $d_{o2}[n]$, $d_{o3}[n]$, ..., $d_{oM}[n]$ are digital output values of the stages subsequent to the target stage.

The correlation module 302 then correlates a series of correction numbers s[n] applied to the target stage with the series of calculation values u[n] according to the following algorithm to generate a series of gain error estimates v[n] corresponding to sample indexes n:

$$v[n] = \frac{u[n]}{s[n]};\quad (5)$$

wherein n is a sample index.

The accumulation module 304 then accumulates a number N of the gain error estimates v[n] generated by the correlation module 302 to obtain a series of accumulation values. The estimate error module 306 then divides the accumulation values by the number N to obtain a series of gain error values ε of the target stage. Thus, the gain error values ε are equal to averages of the series of gain error estimates v[n]. Specifically, the accumulation module 304 and the estimate error module 306 generates the gain error values ε according to the following equation:

$$\varepsilon = \frac{1}{N}\sum_{n=1}^{N} v[n];\quad (6)$$

wherein N is the number of gain error estimates being averaged.

The conventional gain error estimation module 300, however, requires a large amount of memory space to store the gain error estimates v[n] being averaged, because the number N in equation (6) must be a very large number according to equation (3). For example, generation of a gain error value ε requires an average of $2^{20}$ gain error estimates v[n], which requires $2^{20}$ memory cells. The required memory space increases hardware costs of the pipelined ADC comprising the gain error estimation module 300. The large amount of memory space occupied by the gain error estimates v[n], however, increases costs of the pipelined ADC 100. Thus, a method for gain error estimation for an analog-to-digital converter with reduced memory space requirement is desired.

BRIEF SUMMARY OF THE INVENTION

The invention provides a method for gain error estimation in an analog-to-digital converter. In one embodiment, the analog-to-digital converter comprises a plurality of stages. A series of correction numbers applied to a target stage selected from the stages are correlated with a series of calculation values calculated according to digital output values of the stages to generate a series of gain error estimates. The series of gain error estimates are multiplied by a series of updating parameters to obtain a series of first values. A series of previous gain error values are multiplied by one minus the corresponding updating parameters to obtain a series of second values, wherein the series of previous gain values are obtained by delaying the present gain error values. The series of first values and the series of second values are correspondingly added to obtain a series of present gain error values for gain error correction.

The invention also provides a gain error estimation module, installed in an analog-to-digital converter comprising a plurality of stages. In one embodiment, the gain error estimation module comprises a correlation module and a gain error generation module. The correlation module correlates a series of correction numbers applied to a target stage selected from the stages with a series of calculation values calculated according to digital output values of the stages to generate a series of gain error estimates. The gain error generation module multiplies the series of gain error estimates by a series of updating parameters to obtain a series of first values, multiplies a series of previous gain error values by one minus the corresponding updating parameters to obtain a series of second values, and correspondingly adds the series of first values and the series of second values to obtain a series of present gain error values for gain error correction, wherein the series of previous gain error values are obtained by delaying the present gain error values.

The invention also provides a gain error estimation module installed in an analog-to-digital converter comprising a plurality of stages. In one embodiment, the gain error estimation module comprises a correlation module, a plurality of gain error generation modules, and a weighting module. The correlation module correlates a series of correction numbers applied to a target stage selected from the stages with a series of calculation values calculated according to digital output values of the stages to generate a gain error estimate signal. The gain error generation modules respectively weights the gain error estimate signal and one of a plurality of previous gain error value signals according to different updating parameters to obtain a plurality of gain error value signals, and delays the gain error value signals by different delay periods to obtain the previous gain error value signals. The weighting module weights the gain error value signals according to a plurality of weights to obtain a weighted gain value error signal for gain error correction.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
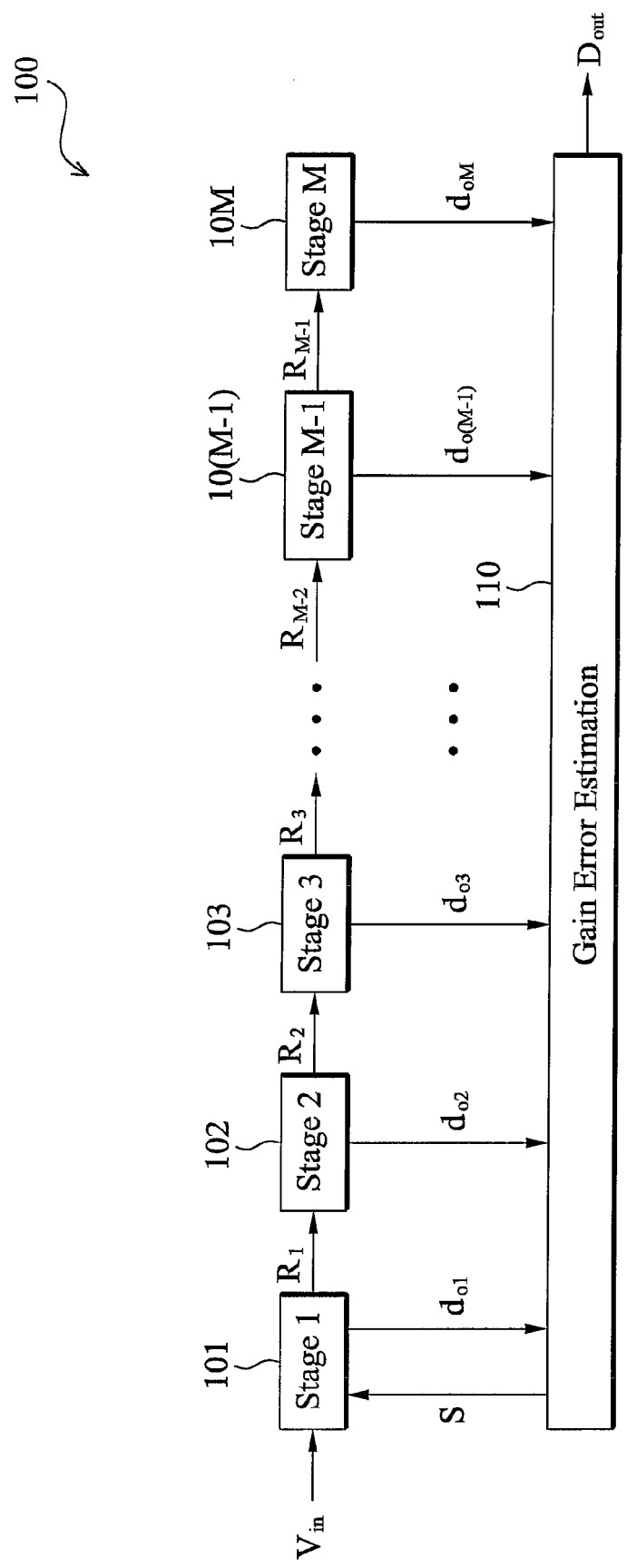
FIG. 1 is a block diagram of a pipelined analog-to-digital converter.
Figure 2A:
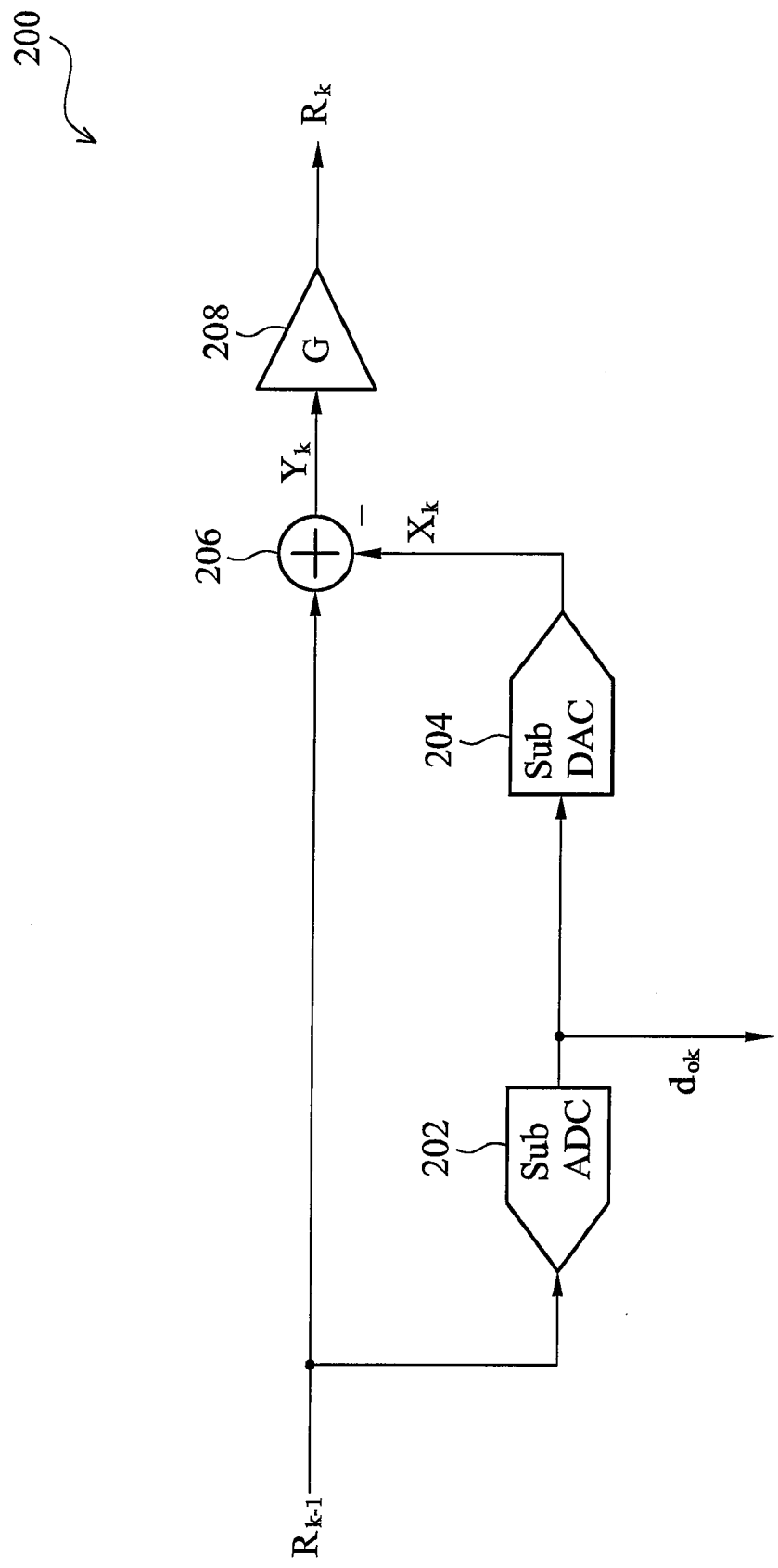
FIG. 2A is a block diagram of an ordinary stage of a pipelined ADC.
Figure 2B:
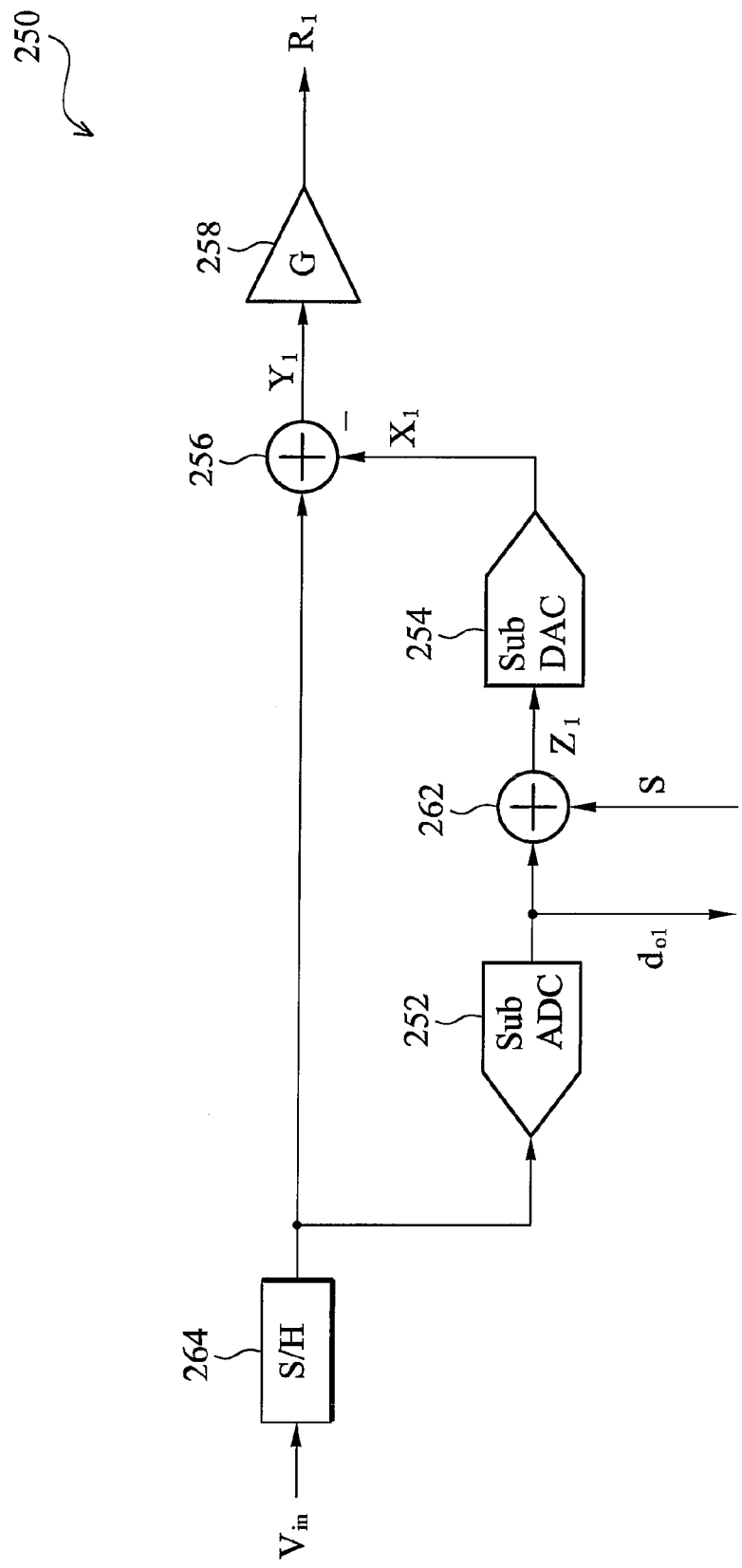
FIG. 2B is a block diagram of a target stage for gain error estimation.
Figure 3:
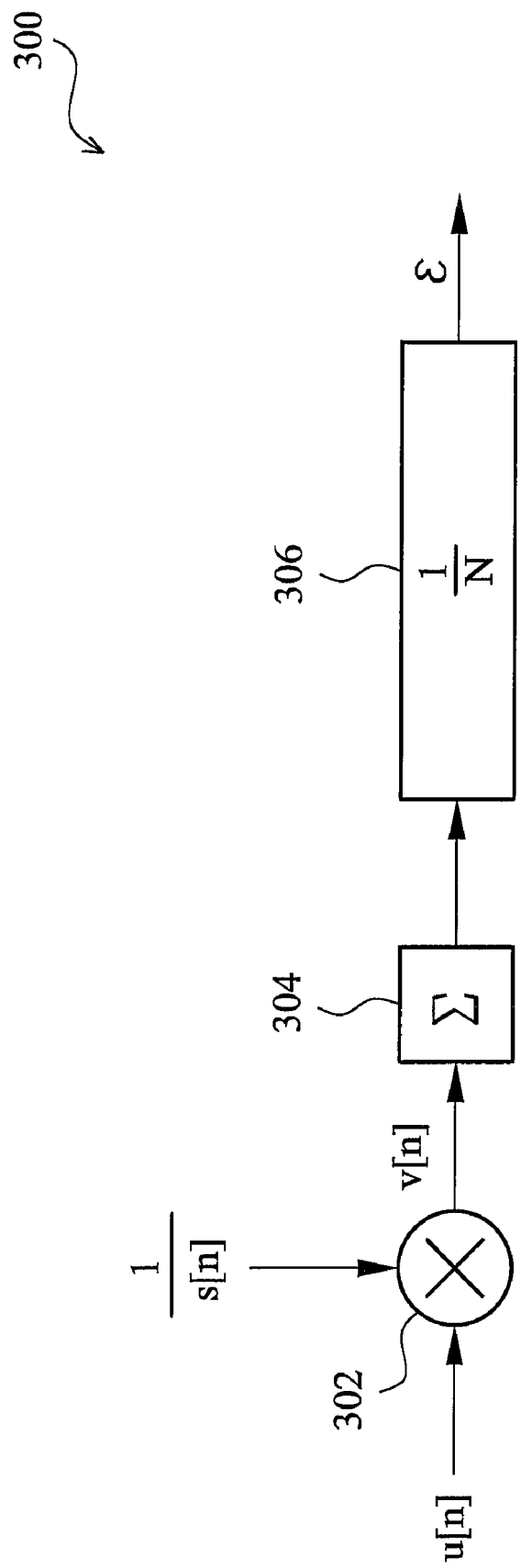
FIG. 3 is a block diagram of a portion of a conventional gain error estimation module of a pipelined ADC.
Figure 4A:
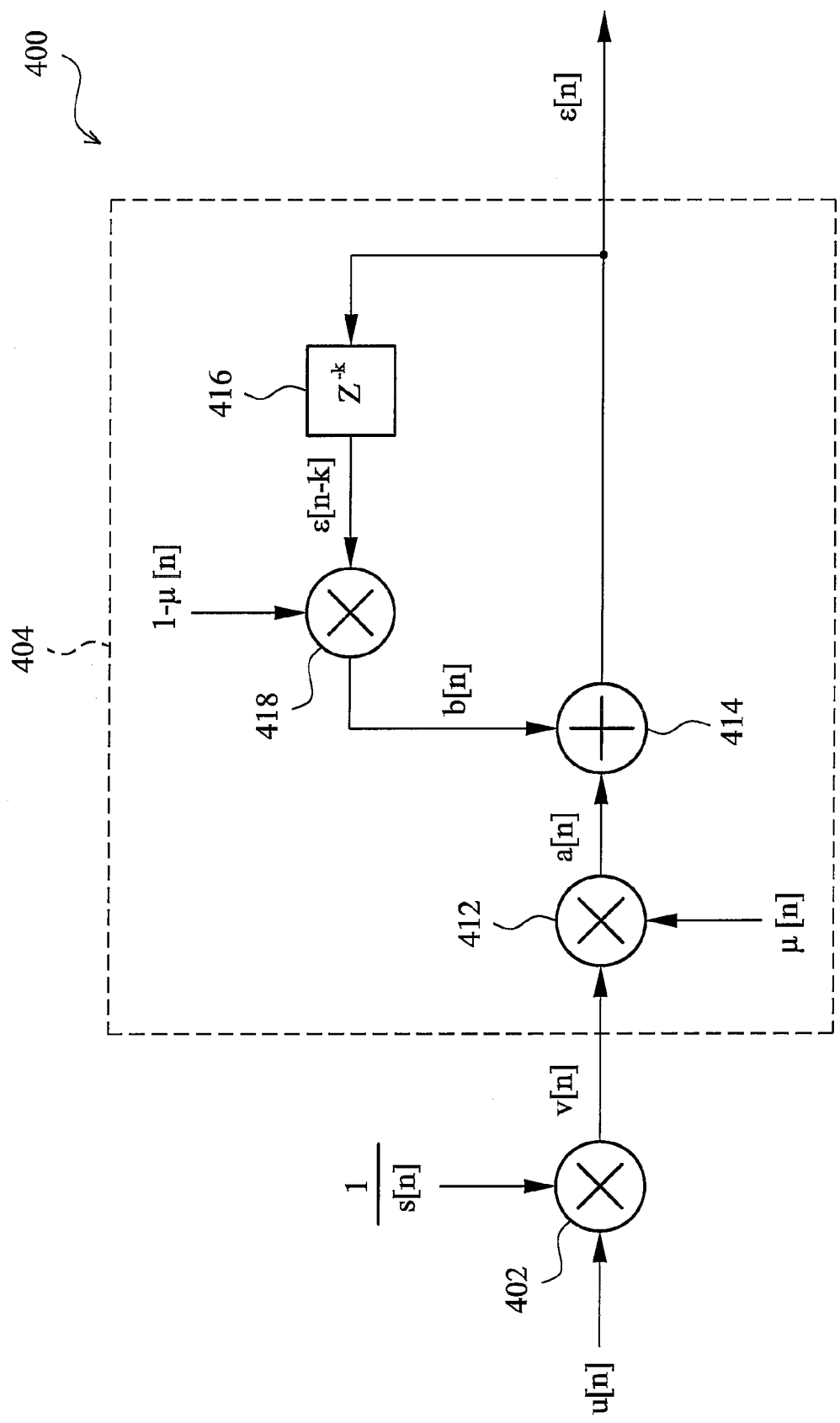
FIG. 4A is a block diagram of a portion of a gain error estimation module generating gain error values according to one embodiment of the invention.

To reduce the memory space required in generation of gain error values $\epsilon$, the invention provides a gain error estimation module which does not directly average the gain error estimates v[n]. Referring to FIG. 4A, a block diagram of a portion of a gain error estimation module 400 generating gain error values according to the invention is shown. The gain error estimation module 400 comprises a correlation module 402 and a gain error generation module 404. The gain error estimation module 400 first derives a series of calculation values u[n] from digital output values of stages of a pipelined ADC according to the equation (4). The correlation module 402 then correlates a series of correction numbers s[n] applied to a target stage of the pipelined ADC with the series of first values u[n] according to the equation (5) to generate a series of gain error estimates v[n]. In one embodiment, the correlation module 402 is a multiplier.

The gain error generation module 404 comprises two multipliers 412 and 418, an adder 414, and a delay module 416. Assume that n is a sample index. The multiplier 412 first multiplies the series of gain error estimates v[n] by a series of updating parameters µ[n] to obtain a series of first values a[n]. The multiplier 418 also multiplies a series of previous gain error values $\epsilon$[n−k] by one minus the corresponding updating parameters (1−µ[n]) to obtain a series of second values b[n]. The adder 414 then correspondingly adds the series of first values a[n] and the series of second values b[n] to obtain a series of present gain error values $\epsilon$[n] for gain error correction of the pipelined ADC. The delay module 416 then delays the present gain error values $\epsilon$[n] by a predetermined period k to obtain the series of previous gain values $\epsilon$[n−k] delivered to the multiplier 418. In one embodiment, the delayed period k is one sample period.

The gain error generation module 404 generates the gain error values $\epsilon$[n] according to the following algorithm:

$$\varepsilon[n] = \mu[n] \cdot \frac{u[n]}{s[n]} + (l - \mu[n]) \cdot \varepsilon[n-k] \quad (7)$$
$$= \mu[n] \cdot v[n] + (l - \mu[n]) \cdot \varepsilon[n-k];$$

wherein n is a sample index, $\epsilon$[n] is the present gain error value, µ[n] is the updating parameter, v[n] is the gain error estimate, and $\epsilon$[n−k] is the previous gain error value. Thus, the present gain error value $\epsilon$[n] comprises two portions, an update portion a[n]=µ[n]×v[n] and a memory portion b[n]= (1−µ[n])×$\epsilon$[n−k], and the updating parameter µ[n] determines a percentage of the present gain error estimate v[n] in the present gain error value $\epsilon$[n]. To generate a gain error value $\epsilon$[n] according to equation (7), the gain error generation module 404 only needs to store the gain error estimate v[n] and the previous gain error values $\epsilon$[n−1], . . . , $\epsilon$[n−k]. Thus, the gain error generation module 404 requires much less memory cells to generate gain error values $\epsilon$[n]. Compared to the conventional gain error estimation module 300 which requires about $2^{20}$ memory cells for gain error estimation, the memory space requirement of the gain error estimation module 400 is greatly reduced.

Figure 4B:
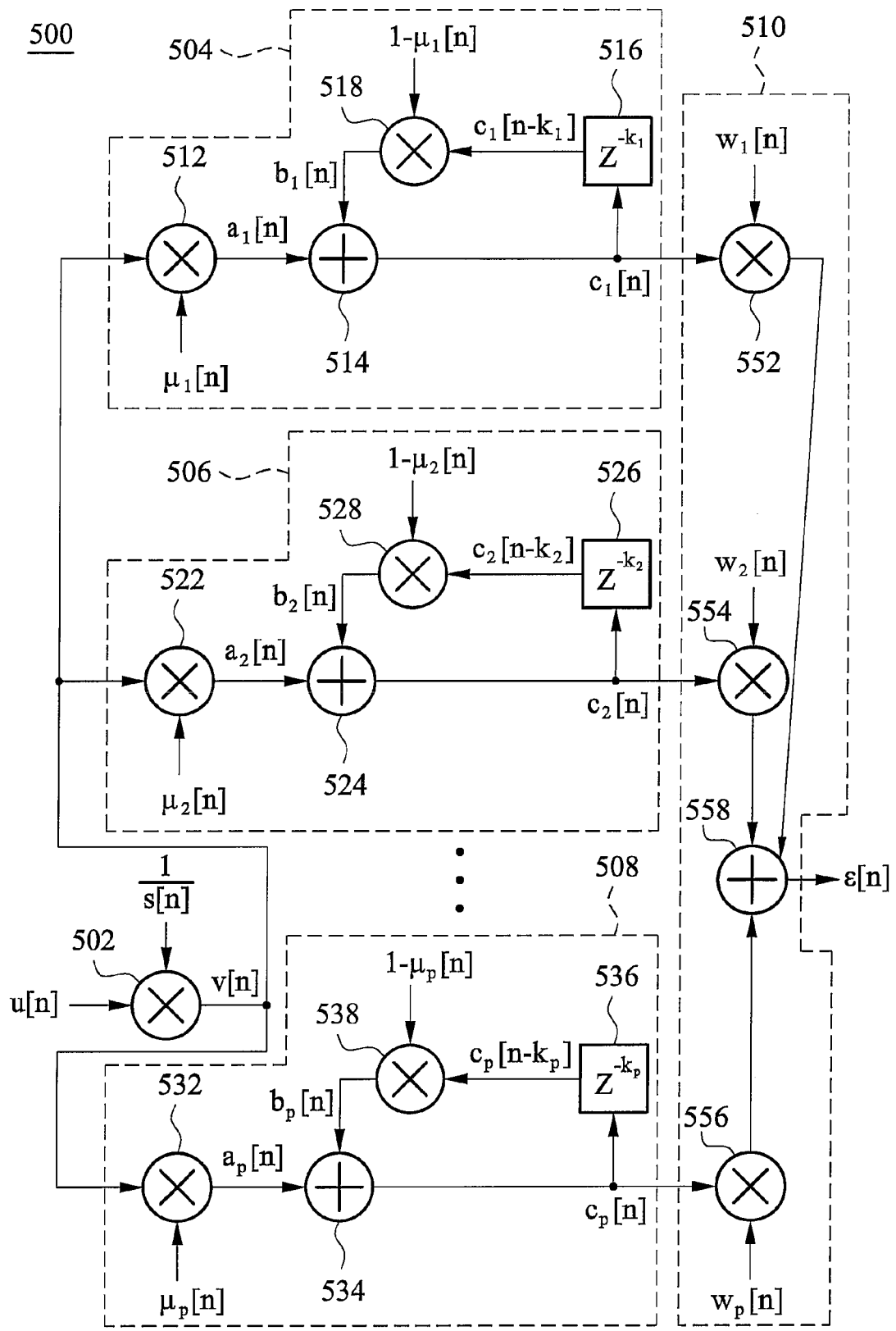
FIG. 4B is a block diagram of a portion of a gain error estimation module generating gain error values according to another embodiment of the invention.

FIG. 4B is a block diagram of a portion of a gain error estimation module 500 generating gain error values according to another embodiment of the invention. The gain error estimation module 500 comprises a correlation module 502, a plurality of gain error generation modules 504, 506, . . . , and 508, and a weighting module 510. The gain error estimation module 500 first derives a series of calculation values u[n] from digital output values of stages of an ADC according to the equation (4). The correlation module 502 then correlates a series of correction numbers s[n] applied to a target stage of the ADC with the series of first values u[n] according to the equation (5) to generate a series of gain error estimates v[n]. In one embodiment, the correlation module 502 is a multiplier.

Assume that the gain error estimation module 500 comprises P gain error generation modules 504, 506, . . . , and 508. Each of the gain error generation modules 504, 506, . . . , and 508 operates similarly to the gain error generation module 404 of FIG. 4A. The gain error generation modules 504, 506, . . . , and 508 respectively have corresponding updating parameters $\mu_1$[n], $\mu_2$[n], . . . , and $\mu_p$[n], and corresponding delayed sample periods $k_1$, $k_2$, . . . , $k_n$. In one embodiment, the delayed sample periods $k_1$, $k_2$, . . . , and $k_n$ are different from each other, and the updating parameters $\mu_1$[n], $\mu_2$[n], . . . , and $\mu_p$[n] are different from each other. For example, the gain error generation module 504 comprises two multipliers 512 and 518, an adder 514, and a delay module 516. Assume that n is a sample index. The multiplier 512 first multiplies the series of gain error estimates v[n] by a series of updating parameters $\mu_1$[n] to obtain a series of first values $a_1$[n]. The multiplier 518 also multiplies a series of previous gain error values $c_1$[n−$k_1$] by one minus the corresponding updating parameters (1−$\mu_1$[n]) to obtain a series of second values $b_1$[n]. The adder 514 then adds the series of first values $a_1$[n] and the series of second values $b_1$[n] to obtain a series of present gain error values $c_1$[n]. The delay module 516 then delays the present gain error values $c_1$[n] by a predetermined period $k_1$ to obtain the series of previous gain values $c_1$[n−$k_1$] delivered to the multiplier 518. Thus, the gain error generation modules 504, 506, . . . , and 508 simultaneously generate a plurality of gain error values $c_1$[n], $c_2$[n], . . . , and $c_p$[n].

The weighting module 510 then weights the gain error values $c_1$[n], $c_2$[n], . . . , and $c_p$[n] generated by the gain error generation modules 504, 506, . . . , and 508 according to weights $w_1$[n], $w_2$[n], . . . , and $w_p$[n], wherein a sum of the weights $w_1$[n], $w_2$[n], . . . , and $w_p$[n] may equal to 1. The weighting module 510 comprises a plurality of multipliers 552, 554, . . . , and 556 and an adder 558. The multipliers 552, 554, . . . , and 556 respectively multiplies the gain error values $c_1$[n], $c_2$[n], . . . , and $c_p$[n] by the weights $w_1$[n], $w_2$[n], . . . , and $w_p[n]$ to obtain a plurality of products $c_1[n] \times w_1[n], \ldots, c_p[n] \times w_p[n]$. The adder 558 then sums the products $c_1[n] \times w_1[n], \ldots, c_p[n] \times w_p[n]$ to obtain a weighted gain error value $\epsilon[n]$ for gain error correction of an ADC.

In other words, the gain error estimation module 500 generates the weighted gain error value $\epsilon[n]$ for gain error correction according to the following algorithm:

$$\varepsilon[n] = \sum_{i=1}^{p} w_i[n] \times \{\mu_i[n] \times v[n] + (1 - \mu_i[n]) \times c_i[n - k_i]\}; \quad (8)$$

wherein n is a sample index, $\epsilon[n]$ is the weighted gain error value, i is an index of the gain error generation modules 504, 506, ..., and 508, p is a number of the gain error generation modules 504, 506, ..., and 508, $\mu_i[n]$ is the updating parameter, $w_i[n]$ is the weight, $k_i$ is the delayed period, $v[n]$ is the gain error estimate, and $c_i[n-k]$ is the delayed gain error value of the gain error generation modules 504, 506, ..., and 508.

For example, the number p of the gain error generation modules 504, 506, ..., and 508 is assumed to be 3. The delayed periods $k_1$, $k_2$, and $k_3$ are respectively 1, 2, and 3 sample periods, $w_1[n]$, $w_2[n]$, and $w3[n]$ are respectively 60%, 30%, and 10%, and $\mu_1[n]$, $\mu_2[n]$, and $\mu_3[n]$ are respectively 1/100, 1/50, and 1/20. The weighted gain error value $\epsilon[n]$ is therefore equal to $$\left(\left[\frac{1}{100}v[n] + \frac{99}{100}c_1[n-1]\right] \times 60\%\right) +$$
$$\left[\left(\frac{1}{50}v[n] + \frac{49}{50}c_2[n-2]\right) \times 30\%\right] +$$
$$\left[\left(\frac{1}{20}v[n] + \frac{19}{20}c_3[n-3] \times 10\%\right]\right) \text{ according to equation (8).}$$

Figure 5:
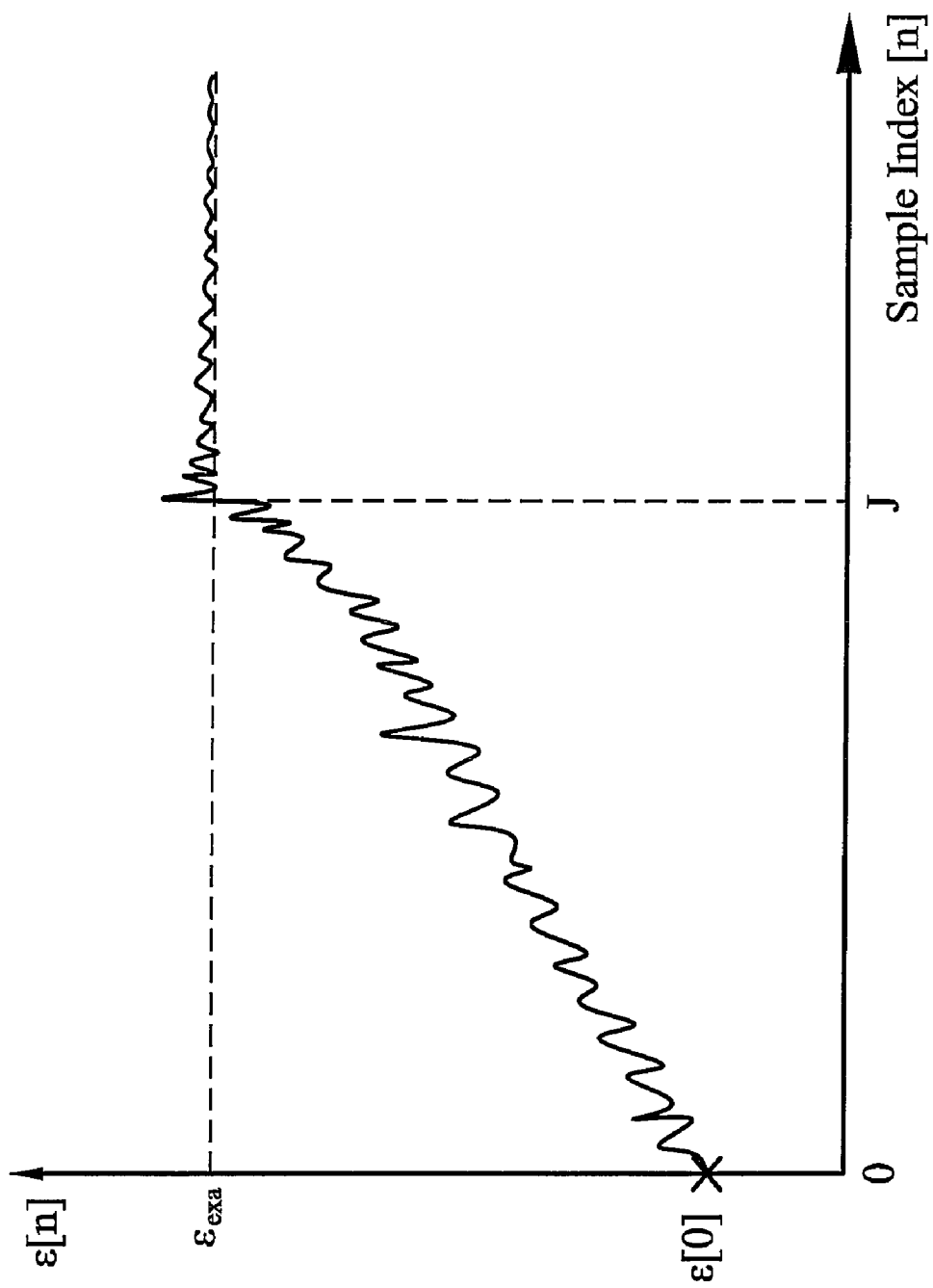
FIG. 5 is a schematic diagram of a convergence process of gain error values generated according to the invention.

To generate a gain error value $\epsilon[1]$ according to equation (7), a present gain error estimate $v[1]$ and a previous gain error value $\epsilon[0]$ are required if the predetermined delay period k is 1. The previous gain error value $\epsilon[0]$ is referred to as an initial value of the gain error value. It is crucial for convergence of the gain error values $F[n]$ to appropriately determine the initial value $\epsilon[0]$. Referring to FIG. 5, a schematic diagram of a convergence process of gain error values $\epsilon[n]$ generated according to equation (7) is shown. The gain error values $\epsilon[n]$ with an initial value $\epsilon[0]$ converges to an exact gain error $\epsilon_{exa}$ with increase of elapsed time, which is represented by a sample index. When the sample index is J, a difference between the gain error value $\epsilon[J]$ and the exact gain error $\epsilon_{exa}$ is less than a threshold. The period between the sample indexes 0 and J is referred to as convergence time. Because the gain error values $\epsilon[n]$ deviates from the exact gain error $\epsilon_{exa}$ by a large distance, the gain error values $\epsilon[n]$ prior to the sample index J cannot be used for gain error correction and are dropped. Thus, the less the convergence time, the better the performance of the gain error estimation module 400.

Because the gain error values $\epsilon[n]$ converges from the initial value $\epsilon[0]$, if the initial value $\epsilon[0]$ is appropriately chosen to approach the exact gain error $\epsilon_{exa}$, the convergence time is reduced. The initial value $\epsilon[0]$ can be determined by a few methods. In one embodiment, the initial value $\epsilon[0]$ is generated according a foreground calibration process. In another embodiment, before a system comprising the ADC goes into a sleep mode or is shut down, a few gain error values $\epsilon[n]$ are stored in advance. When the system restarts, the gain error values $\epsilon[n]$ previously stored are used as the initial value $\epsilon[0]$. In another embodiment, the initial value $\epsilon[0]$ is a predetermined value. The way to determine initial value described above also applies to previous gain error value $c_i[n-k_i]$ in the embodiment show in FIG. 4B.

The updating parameter $\mu[n]$ in FIG. 4A determines a percentage of the present gain error estimate $v[n]$ in the present gain error value $\epsilon[n]$ and is between one and zero. The updating parameter $\mu[n]$ in equation (7) is not necessarily a constant. In one embodiment, the updating parameter $\mu[n]$ changes with the sample index n. In one embodiment, the updating parameters $\mu[n]$ decreases with sample indexes n to reduce the percentage of the present gain error estimate $v[n]$ in the present gain error value $\epsilon[n]$. Thus, in an earlier stage of the convergence process of FIG. 5, the gain error value $\epsilon[n]$ does not converge to the exact gain error $\epsilon_{exa}$ yet, and the present gain error value $\epsilon[n]$ is generated with a higher percentage of the present gain error estimate $v[n]$ to shorten the convergence process. In a later stage of the convergence process of FIG. 5, the gain error value $\epsilon[n]$ has converged to the exact gain error $\epsilon_{exa}$, and the present gain error value $\epsilon[n]$ is generated with a lower percentage of the present gain error estimate $v[n]$ to maintain stability of the gain error value $\epsilon[n]$.

The invention provides a gain error estimation module estimating a gain error value of a target stage of an ADC. The gain error estimation module generates a present gain error value according to a previous gain error value and a present gain error estimate derived from digital output values of the stages of the ADC. Thus, only memory space storing the previous gain error value and the present gain error estimate is required for the gain error estimation module to generate a gain error value, reducing the hardware cost of the ADC.

Before a system comprising an ADC operating according to the invention enters a sleep mode or is shut down, all of relevant values stored in a memory of the ADC, such as the previous gain error values $\epsilon[n-1], \ldots, \epsilon[n-k]$ of FIG. 4A according to equation (7), may be saved in advance. When the system returns to a wakeup mode or is restarted, the saved values may be restored to the memory of the ADC, thus a gain error estimation module of the ADC may directly derive a gain error values $\epsilon[n]$ from a gain error estimate $v[n]$ and the restored gain error values $\epsilon[n-1], \ldots, \epsilon[n-k]$ in the memory according to the invention.

The method provided by the invention is suitable for gain errors estimation for any stage selected from a plurality of stages of an ADC. In addition, although the method provided by the invention is illustrated with a pipelined ADC, because a cyclic ADC has a similar structure to that of a pipelined ADC, except that the stages of a cyclic ADC may share a common circuit, the method provided by the invention is also applicable to a cyclic ADC.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for gain error estimation in an analog-to-digital converter, wherein the analog-to-digital converter comprises a plurality of stages, the method comprising:

correlating a series of correction numbers applied to a target stage selected from the stages with a series of calculation values calculated according to digital output values of the stages to generate a series of gain error estimates;

multiplying the series of gain error estimates by a series of updating parameters to obtain a series of first values;

multiplying a series of previous gain error values by one minus the corresponding updating parameters to obtain a series of second values;

correspondingly adding the series of first values and the series of second values to obtain a series of present gain error values for gain error correction;

wherein the series of previous gain values are obtained by delaying the present gain error values.

2. The method as claimed in claim 1, wherein the series of updating parameters is between one and zero.

3. The method as claimed in claim 2, wherein the series of updating parameters decrease with sample indexes of the corresponding gain error estimates multiplied therewith.

4. The method as claimed in claim 1, wherein an initial value of the series of the previous gain error values is generated in a foreground calibration process.

5. The method as claimed in claim 1, wherein an initial value of the series of the previous gain error values is a restored present gain error value generated before a system including the analog-to-digital converter goes into a sleep mode.

6. The method as claimed in claim 1, wherein the present gain error values are obtained according to the following algorithm:

$$\epsilon[n]=\mu[n]\cdot v[n]+(1-\mu[n])\cdot\epsilon[n-k];$$

wherein n is a sample index, $\epsilon[n]$ is the present gain error value, $\mu[n]$ is the updating parameter, $v[n]$ is the gain error estimate, and $\epsilon[n-k]$ is the previous gain error value.

7. The method as claimed in claim 1, wherein the calculation values are calculated according to the following algorithm:

$$u[n]=d_{o1}[n]+s[n]+d_{o2}[n]\times G^{-1}+d_{o3}[n]\times G^{-2}+\Lambda+d_{oM}[n]\times G^{-(M-1)};$$

wherein $u[n]$ is the calculation value, n is a sample index, $s[n]$ is the correction number, M is a number of the stages, G is a predetermined gain of the stages, $d_{o1}$ is the digital output value of the target stage, and $d_{o2}[n]$, $d_{o3}[n]$, ..., $d_{oM}[n]$ are the digital output values of the stages subsequent to the target stage.

8. The method as claimed in claim 1, wherein the gain error estimates are generated according to the following algorithm:

$$v[n]=\frac{u[n]}{s[n]};$$

wherein $v[n]$ is the gain error estimate, n is a sample index, $s[n]$ is the correction number, and $u[n]$ is the corresponding calculation value.

9. The method as claimed in claim 1, wherein the analog-to-digital converter is a pipelined analog-to-digital converter or a cyclic analog-to-digital converter.

10. A gain error estimation module, installed in an analog-to-digital converter comprising a plurality of stages, comprising:

a correlation module, correlating a series of correction numbers applied to a target stage selected from the stages with a series of calculation values calculated according to digital output values of the stages to generate a series of gain error estimates;

a gain error generation module, coupled to the correlation module, multiplying the series of gain error estimates by a series of updating parameters to obtain a series of first values, multiplying a series of previous gain error values by one minus the corresponding updating parameters to obtain a series of second values, and correspondingly adding the series of first values and the series of second values to obtain a series of present gain error values for gain error correction;

wherein the series of previous gain values are obtained by delaying the present gain error values.

11. The gain error estimation module as claimed in claim 10, wherein the gain error generation module comprises:

a first multiplier, coupled to the correlation module, multiplying the series of gain error estimates by the series of updating parameters to obtain the series of first values;

a second multiplier, coupled to a delay module, multiplying the series of previous gain error values by one minus the corresponding updating parameters to obtain the series of second values;

an adder, coupled to the first multiplier and the second multiplier, correspondingly adding the series of first values and the series of second values to obtain the series of present gain error values for gain error correction; and the delay module, coupled to the adder, delaying the present gain error values by a predetermined period to obtain the series of previous gain values.

12. The gain error estimation module as claimed in claim 10, wherein the series of updating parameters is between one and zero.

13. The gain error estimation module as claimed in claim 12, wherein the series of updating parameters decrease with sample indexes of the corresponding gain error estimates multiplied therewith.

14. The gain error estimation module as claimed in claim 10, wherein an initial value of the series of the previous gain error values is generated according a foreground calibration process.

15. The gain error estimation module as claimed in claim 10, wherein an initial value of the series of the previous gain error values is a restored present gain error value generated before a system including the analog-to-digital converter goes into a sleep mode.

16. The gain error estimation module as claimed in claim 10, wherein the gain error generation module generates the present gain error values according to the following algorithm:

$$\epsilon[n]=\mu[n]\cdot v[n]+(1+\mu[n])\cdot\epsilon[n-k];$$

wherein n is a sample index, $\epsilon[n]$ is the present gain error value, $\mu[n]$ is the updating parameter, $v[n]$ is the gain error estimate, and $\epsilon[n-k]$ is the previous gain error value.

17. The gain error estimation module as claimed in claim 10, wherein the calculation values are calculated according to the following algorithm:

$$u[n]=d_{o1}[n]+s[n]+d_{o2}[n]\times G^{-1}+d_{o3}[n]\times G^{-2}+\Lambda+d_{oM}[n]\times G^{-(M-1)};$$

wherein $u[n]$ is the calculation value, n is a sample index, $s[n]$ is the correction number, M is a number of the stages, G is a predetermined gain of the stages, $d_{o1}$ is the digital output value of the target stage, and $d_{o2}[n]$, $d_{o3}[n]$, ..., $d_{oM}[n]$ are the digital output values of the stages subsequent to the target stage.

18. The gain error estimation module as claimed in claim 10, wherein the correlation module is a multiplier generating the gain error estimates according to the following algorithm:

$$v[n] = \frac{u[n]}{s[n]};$$

wherein v[n] is the gain error estimate, n is a sample index, s[n] is the correction number, and u[n] is the corresponding calculation value.

19. The gain error estimation module as claimed in claim 10, wherein the analog-to-digital converter is a pipelined analog-to-digital converter or a cyclic analog-to-digital converter.

20. A gain error estimation module, installed in an analog-to-digital converter comprising a plurality of stages, comprising:
- a correlation module, correlating a series of correction numbers applied to a target stage selected from the stages with a series of calculation values calculated according to digital output values of the stages to generate a gain error estimate signal;
- a plurality of gain error generation modules, each coupled to the correlation module, weighting the gain error estimate signal and one of a plurality of previous gain error value signals according to one of a plurality of updating parameters to obtain one of a plurality of gain error value signals, and delaying the one of gain error value signals by one of a plurality of delay periods to obtain the one of previous gain error value signals; and
- a weighting module, weighting the gain error value signals according to a plurality of weights to obtain a weighted gain value error signal for gain error correction.

21. The gain error estimation module as claimed in claim 20, wherein each of the gain error generation modules comprises:
- a first multiplier, coupled to the correlation module, multiplying the gain error estimate signal by an updating parameter to obtain a first value signal;
- a second multiplier, coupled to a delay module, multiplying the previous gain error value signal by one minus the corresponding updating parameter to obtain a second value signal;
- a first adder, coupled to the first multiplier and the second multiplier, correspondingly adding the first value signal and the second value signal to obtain the gain error value signal corresponding to the gain error generation module; and
- the delay module, coupled to the first adder, delaying the gain error value signal by a delay period to obtain the previous gain value signal.

22. The gain error estimation module as claimed in claim 20, wherein the weighting module comprises:
- a plurality of third multipliers, respectively multiplying the gain error value signals by the weights to obtain a plurality of products; and
- a second adder, summing the products to obtain the weighted gain error value signal for gain error correction of the analog-to-digital converter.

23. The gain error estimation module as claimed in claim 20, wherein the gain error estimation module generates the weighted gain error value signal according to the following algorithm:

$$\varepsilon[n] = \sum_{i=1}^{p} w_i[n] \times \{\mu_i[n] \times v[n] + (1 - \mu_i[n]) \times c_i[n - k_i]\};$$

wherein n is a sample index, $\varepsilon[n]$ is the weighted gain error value signal, i is an index of the gain error generation modules, p is a number of the gain error generation modules, $\mu_i[n]$ is the updating parameter, $w_i[n]$ is the weight, $k_i$ is the delayed period, v[n] is the gain error estimate signal, and $c_i[n-k]$ is the previous gain error value signal.

24. The gain error estimation module as claimed in claim 20, wherein the analog-to-digital converter is a pipelined analog-to-digital converter or a cyclic analog-to-digital converter.

* * * * *